United States Patent
Tien et al.

(10) Patent No.: US 10,270,028 B1
(45) Date of Patent: Apr. 23, 2019

(54) MEMORY DEVICE AND METHOD FOR MANUFACTURING THE SAME

(71) Applicant: TAIWAN SEMICONDUCTOR MANUFACTURING CO., LTD., Hsinchu (TW)

(72) Inventors: Hsi-Wen Tien, Hsinchu County (TW); Chih-Wei Lu, Hsinchu (TW); Wei-Hao Liao, Taichung (TW); Pin-Ren Dai, New Taipei (TW); Chung-Ju Lee, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/813,055

(22) Filed: Nov. 14, 2017

(51) Int. Cl.
*H01L 43/08* (2006.01)
*H01L 43/12* (2006.01)
*H01L 27/22* (2006.01)

(52) U.S. Cl.
CPC ............ *H01L 43/12* (2013.01); *H01L 27/228* (2013.01); *H01L 43/08* (2013.01)

(58) Field of Classification Search
CPC ......... H01L 21/76877; H01L 21/76802; H01L 45/1253; H01L 45/126; H01L 45/1683; H01L 29/0684; H01L 43/08; H01L 23/5283; H01L 21/8221; H01L 21/76831; H01L 21/76865; H01L 21/28282; H01L 21/02197; H01L 45/04; H01L 45/146; H01L 45/1675; H01L 45/06; H01L 45/085; H01L 45/124; H01L 45/1233; H01L 45/1246; H01L 45/14; G11C 13/003; G11C 17/16; G11C 17/18; G11C 2213/76

See application file for complete search history.

(56) References Cited

U.S. PATENT DOCUMENTS

| | | | |
|---|---|---|---|
| 9,142,762 B1 * | 9/2015 | Li | H01L 43/12 |
| 9,564,577 B1 * | 2/2017 | Hsu | H01L 43/02 |
| 2008/0308781 A1 * | 12/2008 | Liao | H01L 45/145 257/2 |
| 2009/0039451 A1 * | 2/2009 | Ueno | H01L 27/228 257/421 |
| 2014/0264246 A1 * | 9/2014 | Walls | H01L 45/1253 257/4 |
| 2017/0069835 A1 * | 3/2017 | Sonoda | H01L 43/12 |
| 2017/0084819 A1 * | 3/2017 | Lu | H01L 43/02 |

FOREIGN PATENT DOCUMENTS

WO WO2011088359 * 7/2011 ............. H01L 43/08

* cited by examiner

*Primary Examiner* — Caridad Everhart

(74) *Attorney, Agent, or Firm* — Maschoff Brennan

(57) ABSTRACT

A method for manufacturing a memory device, the method includes forming an opening in a dielectric layer; overfilling the opening with a bottom electrode layer; removing a first portion of the bottom electrode layer outside the opening, while leaving a second portion of the bottom electrode layer in the opening to form a bottom electrode; and forming a stack over the bottom electrode, the stack comprising a resistance switching element in contact with the bottom electrode and a top electrode over the resistance switching element.

20 Claims, 7 Drawing Sheets

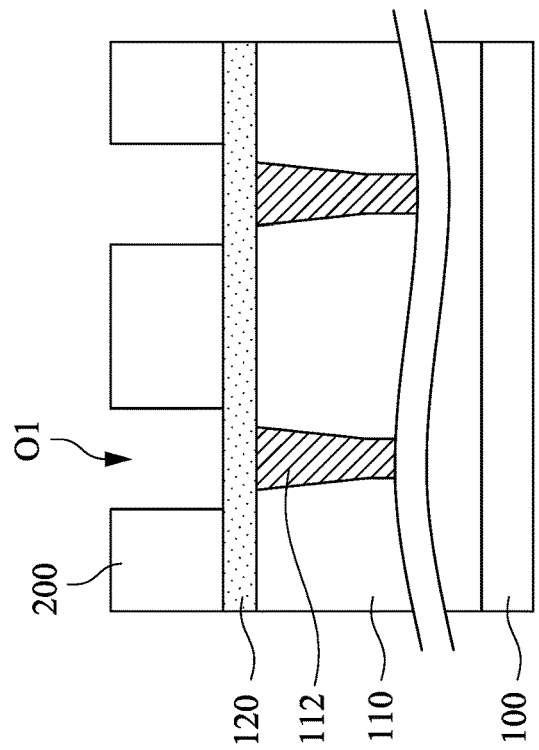
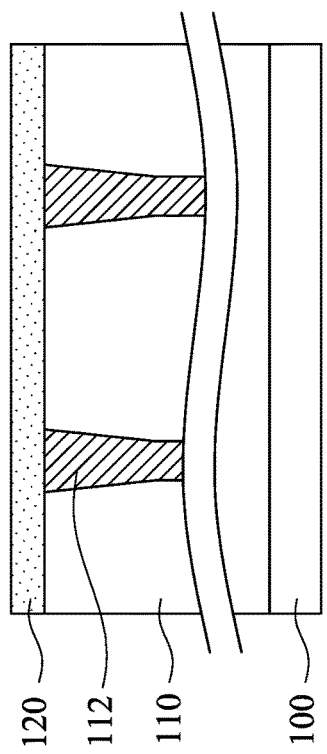
Fig. 1B
Fig. 1A

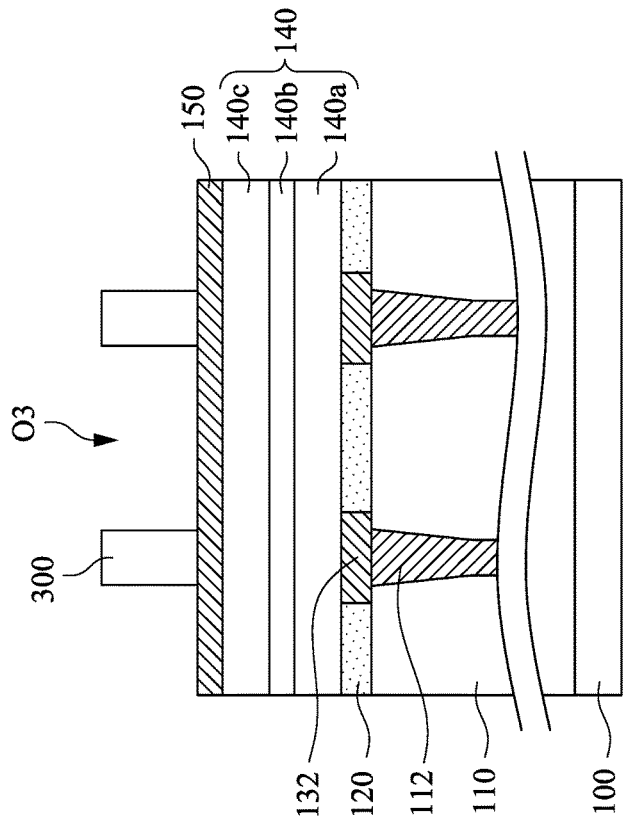
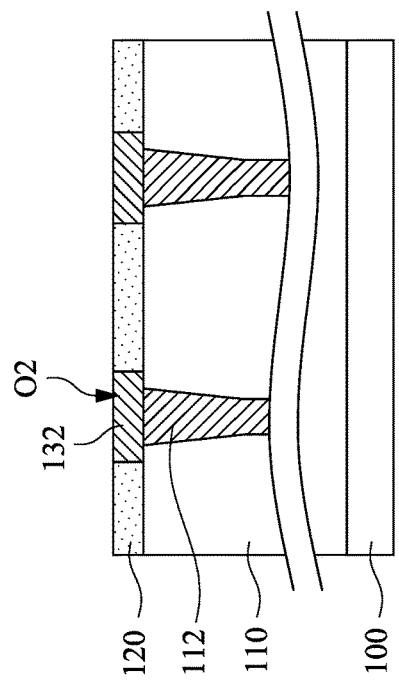
Fig. 1F
Fig. 1E

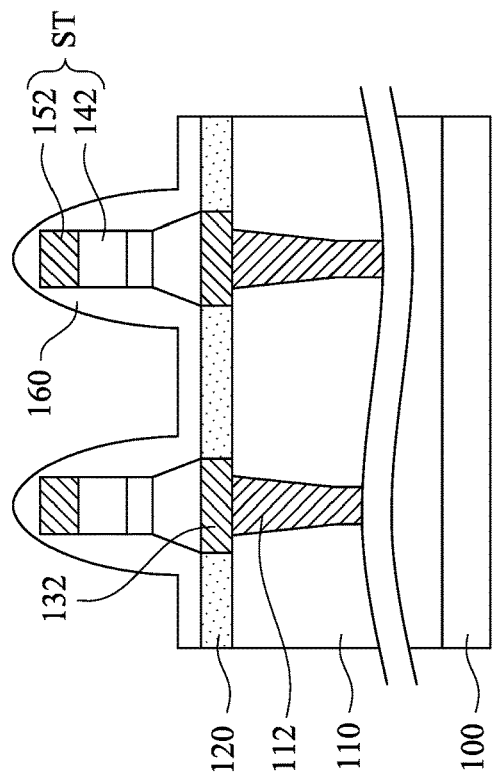
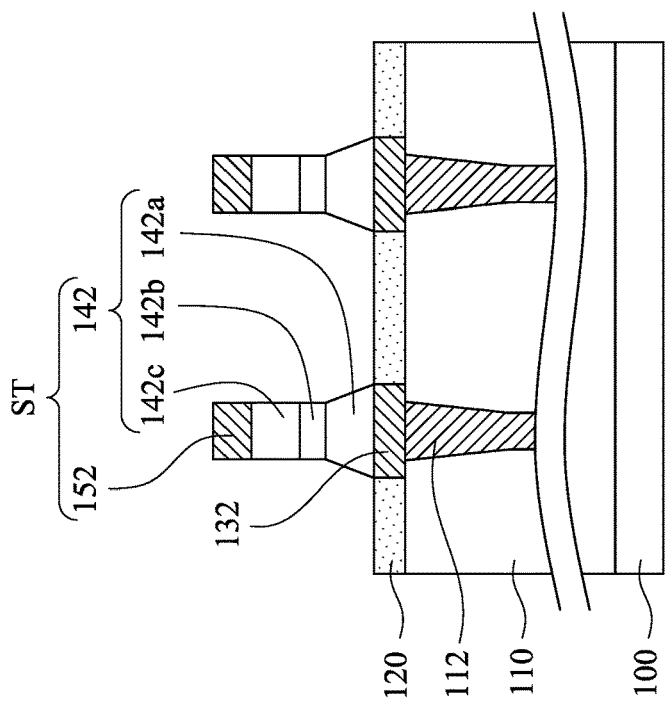
Fig. 1H
Fig. 1G

MEMORY DEVICE AND METHOD FOR MANUFACTURING THE SAME

BACKGROUND

Semiconductor memories are used in integrated circuits for electronic applications, including radios, televisions, cell phones, and personal computing devices, as examples. One type of semiconductor memory device involves spin electronics, which combines semiconductor technology and magnetic materials and devices. The spins of electrons, through their magnetic moments, rather than the charge of the electrons, are used to indicate a bit.

One such spin electronic device is magnetoresistive random access memory (MRAM) array, which includes conductive lines (word lines and bit lines) positioned in different directions, e.g., perpendicular to each other in different metal layers. The conductive lines sandwich a magnetic tunnel junction (MTJ), which functions as a magnetic memory cell.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A through 1K are cross-sectional views of an integrated circuit in various stages of fabrication in accordance with some embodiments of the present disclosure.

DETAILED DESCRIPTION

Figure 1D:
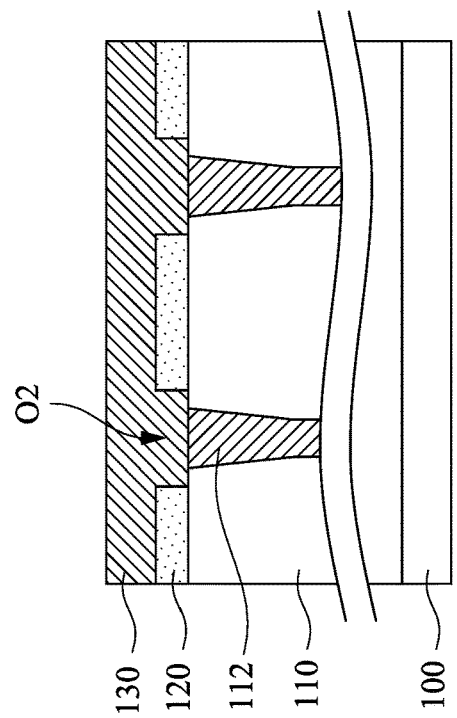

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A magnetic random-access memory (MRAM) device and the method of forming the same are provided in accordance with various exemplary embodiments. The intermediate stages of forming the MRAM device are illustrated. The variations of the embodiments are discussed. Throughout the various views and illustrative embodiments, like reference numbers are used to designate like elements.

FIGS. 1A through 1K are cross-sectional views of an integrated circuit (IC) in various stages of fabrication in accordance with some embodiments of the present disclosure. FIG. 1A illustrates a wafer having a substrate 100 thereon. The substrate 100 includes an interlayer dielectric (ILD) layer or inter-metal dielectric (IMD) layer 110 with metallization pattern 112. The ILD layer 110 may be an extra low-k dielectric (ELK) layer, such as carbon doped silicon dioxide, may b e an oxide, such as silicon oxide, and/or may be the like or a combination thereof. In some embodiments, the ILD layer 110 may be formed of a low-k dielectric material having a k value less than about 3.9. The k value of the ILD layer 110 may even be lower than about 2.8. The metallization pattern 112 may be copper, aluminum, the like, and/or a combination thereof. The substrate 100 may also include active and passive devices, for example, underlying the ILD layer 110. These further components are omitted from the figures for clarity, and how these components are formed will be readily apparent to a person having ordinary skill in the art.

A dielectric layer 120 is formed over the ILD layer 110. In some embodiments, the dielectric layer 120 may act as an etch stop layer or a chemical-mechanical polish (CMP) stop layer against one or more subsequent etching or CMP processes. The dielectric layer 120 may be formed of dielectric material different from the underlying ILD layer 110. For example, the ILD layer 110 may be a silicon oxide layer, and the dielectric layer 120 may be a silicon nitride layer.

Reference is made to FIG. 1B. A patterned mask 200 is formed over the dielectric layer 120. The patterned mask 200 has openings O1 corresponding to array of memory cell subsequently formed. The mask 200 may be a single layer or a multi-layer structure. The patterned mask 200 includes at least one photo-sensitive element, such as a photo-acid generator (PAG), so that the patterned mask can be formed using a suitable photolithography process.

Figure 1C:
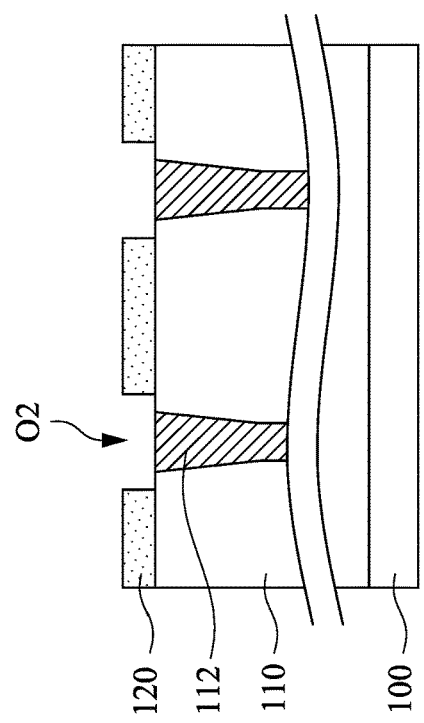

Reference is made to FIG. 1C. The dielectric layer 120 is patterned through the openings O1 of the patterned mask 200, such that trenches or openings O2 are formed in the dielectric layer 120. In some embodiments, the openings O2 penetrate through the dielectric layer 120 and expose the metallization pattern 112. After patterning the dielectric layer 120, the patterned mask 200 can be removed using, for example, an ashing process.

Reference is made to FIG. 1D. A bottom electrode layer 130 is formed over the dielectric layer 120 and overfills the openings O2. The bottom electrode layer 130 may be formed of conductive materials, such as copper, aluminum, tantalum, tungsten, tantalum nitride (TaN), titanium, titanium nitride (TiN), the like, and/or a combination thereof. The bottom electrode layer 130 may be a single-layered structure or a multilayered structure. For example, the bottom electrode layer 130 may include a tantalum nitride layer and a titanium nitride layer over the tantalum nitride layer. In some embodiments, the bottom electrode layer 130 has a thickness in a range from about 50 angstroms to about 350 angstroms. The bottom electrode layer 130 can be formed using suitable deposition techniques, such as chemical vapor deposition (CVD), physical vapor deposition (PVD), atomic layer deposition (ALD), the like, and/or combinations thereof.

Reference is made to FIG. 1E. Portions of the bottom electrode layer 130 outside the openings O2 are removed while portions of the bottom electrode layer 130 are left in the openings O2 to form bottom electrodes 132. In some embodiments, the removing the portions of the bottom electrode layer 130 includes at least one planarization process, such as etching back or chemical-mechanical polish (CMP) process. In some embodiments where etch backing is performed, the bottom electrode layer 130 is etched back until reaching the dielectric layer 120, in which the dielectric layer 120 has higher etch resistance to the etching back than that of the bottom electrode layer 130. For example, the etching rate of the dielectric layer 120 is slower than the etching rate of the bottom electrode layer 130 in the etching back process. In this way, the etching back process is performed until the top surface of the dielectric layer 120 is exposed. In some embodiments, the etching back is a dry etching process. In some embodiments, the dry etching process may comprise an etchant chemistry having gases including $CF_4$, $CH_3F$, $CH_2F_2$, $CHF_3$, $C_{12}$, $BCl_3$ and/or other chemicals, as examples.

In some embodiments where CMP process is performed, the bottom electrode layer 130 is polished until reaching the dielectric layer 120, in which the dielectric layer 120 has higher resistance to the CMP process than that of the bottom electrode layer 130. For example, the polish rate of the dielectric layer 120 is slower than the polish rate of the bottom electrode layer 130 in the CMP process. In this way, the CMP process is performed until the top surface of the dielectric layer 120 is exposed. In some embodiments, the slurry used in the CMP process has high selectivity between the dielectric layer 120 and the bottom electrode layer 130. For example, the slurry may include aluminum oxide, potassium hydroxide, malonic acid, ferric nitrate, de-ionized water, or any combination thereof. Therefore, the dielectric layer 120 can have higher resistance to the slurry used to polish the bottom electrode layer 130 than that of the bottom electrode layer 130, so that the dielectric layer 120 can stop the CMP process.

As a result of the etching back or CMP process, a top surface of at least one of the bottom electrodes 132 is substantially level with or flush with a top surface of the dielectric layer 120. That is, the top surface of at least one of the bottom electrodes 132 and the top surface of the dielectric layer 120 are substantially coplanar.

Reference is made to FIG. 1F. A resistance switching element layer 140 is formed above the dielectric layer 120 and the bottom electrodes 132. To be specific, the resistance switching element layer 140 is formed along the top surfaces of the bottom electrodes 132 and the top surface of the dielectric layer 120. The resistance switching element layer 140 may be formed using suitable deposition techniques, such as CVD, PVD, ALD, the like, and/or combinations thereof.

In some embodiments, the resistance switching element layer 140 includes a magnetic tunnel junction (MTJ). In such embodiments, the resistance switching element layer 140 may include a pinning layer 140a, a tunnel barrier layer 140b, and a free layer 140c. The magnetic moment of the free layer 140c may be programmed causing a resistance of a resulting MTJ cell to be changed between a high resistance and a low resistance.

Then, a top electrode layer 150 is formed over the resistance switching element layer 140. The top electrode layer 150 may be formed using suitable deposition techniques, such as CVD, PVD, ALD, the like, and/or combinations thereof. In some embodiments, the top electrode layer 150 may be formed of conductive materials, such as copper, aluminum, tantalum, tungsten, tantalum nitride (TaN), titanium, titanium nitride (TiN), the like, and/or a combination thereof.

Then, a patterned photoresist layer 300 is formed over the top electrode layer 150. Formation of the patterned photoresist layer 300 includes a photolithography process, which may include one or more exposure, developing, rinsing, and baking processes (not necessarily performed in this order). As a result of the photolithography process, the patterned photoresist layer 300 may have one or more trenches or openings O3. The trenches or openings O3 of the patterned photoresist layer 300 may expose the underlying top electrode layer 150. In some embodiments, the pattern of the patterned photoresist layer 300 may correspond with the pattern of the bottom electrodes 132. Optionally, a bottom anti-reflective coating (BARC), such as organic ARC or inorganic ARC, may be formed underlying the photoresist layer 300. The BARC may be formed of silicon oxynitride, silicon rich oxide, nitrogen-free ARC materials including SiOC, or combinations thereof.

Reference is made to FIG. 1G. The top electrode layer 150 is patterned through the openings O3 of the patterned photoresist layer 300 to form top electrodes 152. During the patterning, portions of the top electrode layer 150 which are not over the bottom electrodes 132 are removed. The top electrodes 152 may be used as hard masks for the patterning of the underlying layers in some embodiments. In some embodiments where the top electrode layer 150 is formed of copper, aluminum, tantalum, tungsten, tantalum nitride (TaN), titanium, or titanium nitride (TiN), the etchant may include halogen-containing compound such as $CF_4$, $CHF_3$, $CH_2F_2$, $Cl_2$, $BCl_3$, or $SiCl_4$. Next, an ashing is performed to remove the photoresist layer 300. In some embodiments, the ashing process is performed using oxygen-containing gases. In other embodiments, the ashing process is performed using oxygen-free process gases such as a combined gas of nitrogen and hydrogen. Advantageously, with oxygen-free process gases, oxidation of the free layer of the resistance switching element layer 140 can be prevented.

Subsequently, the resistance switching element layer 140 is then patterned, for example, using the top electrodes 152 as hard masks, to form resistance switching elements 142 including a pinning layer 142a, a tunnel barrier layer 142b, and a free layer 142c. To be specific, the patterning may include removing a portion of the resistance switching element layer 140 over the dielectric layer 120 and leaving a portion of the resistance switching element layer 140 over the bottom electrode 132 to form the resistance switching element 142.

In some embodiments, the removing includes an etching operation to the resistance switching element layer 140. In some embodiments, the dielectric layer 120 has higher etch resistance to the etching operation than that of the resistance switching element layer 140, such that the resistance switching element layer 140 is etched until reaching the dielectric layer 120. In this way, the dielectric layer 120 can act as an etch stop layer that slows down or even stops the etching operation. In some embodiments, because the dielectric layer 120 also experiences the etch operation used to form the resistance switching elements 142, a portion of the dielectric layer 120 is thinned by the etching operation. In some embodiments, the steps of etching top electrode layer 150 and etching the resistance switching element layer 140 are referred to as "in-situ" performed to indicate that no vacuum-break occurs between these two steps. In some embodiments, the etchant includes alkanols, such as methanol ($CH_3OH$), ethanol, and butanol, or a carbon oxide(s) combined with an ammonia-containing compound(s) (e.g. $CO+NH_3$). For clear illustration, a combination of one of the resistance switching elements 142 and one of the top electrodes 152 over said one of the resistance switching elements 142 is referred to a stack ST in the whole description.

Reference is made to FIG. 1H. A first spacer layer 160 is blanket formed over the dielectric layer 120 and along sidewalls and top surfaces of the stacks ST. Herein, the first spacer layer 160 is formed along sidewalls and top surfaces of the stacks ST. The first spacer layer 160 may include suitable dielectric materials such as silicon nitride, silicon carbide, carbon-doped silicon nitride, carbon-doped silicon oxide, silicon oxynitride, and combinations thereof. In some embodiments, the first spacer layer 160 may also be a composite layer including two or more layers made of different materials, such as a silicon nitride/silicon carbide stack. The first spacer layer 160 may be formed using CVD, PVD, ALD, the like, and/or combinations thereof.

Figure 1J:
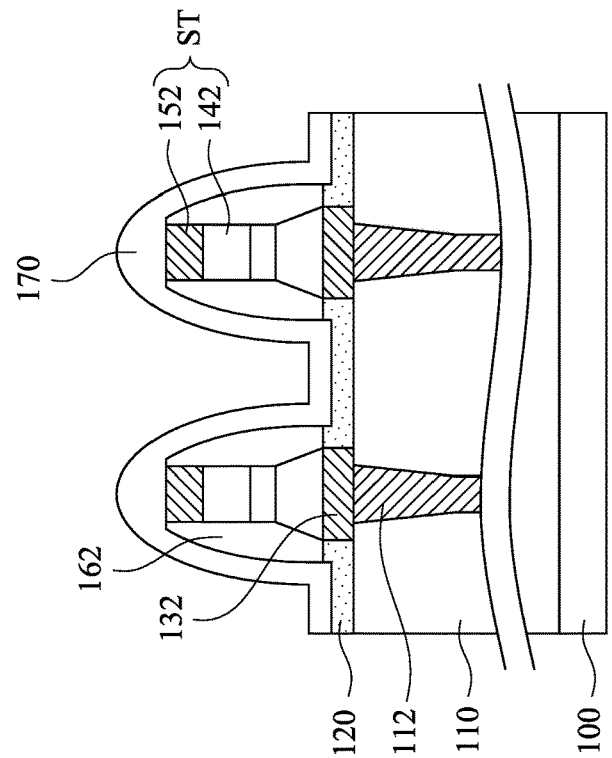
Figure 1I:
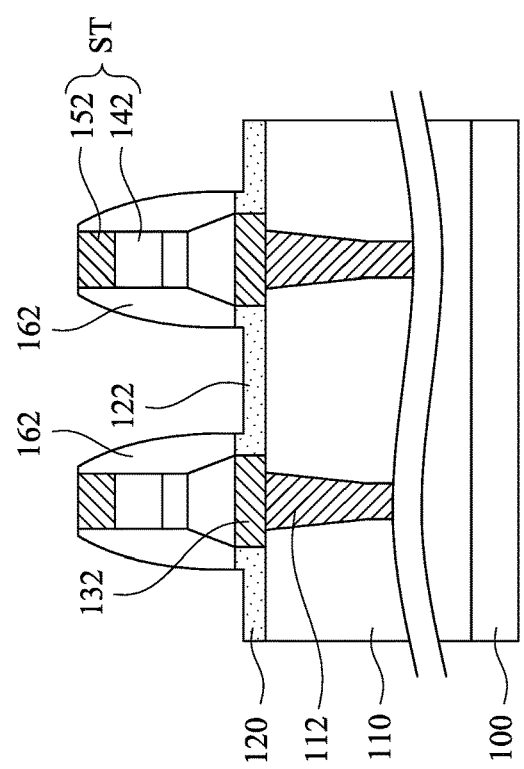

FIG. 1I illustrates patterning of the first spacer layer 160. The patterning process removes horizontal portions of the first spacer layer 160, while vertical portions of the first spacer layer 160 remain along sidewalls of the stacks ST and around the stacks ST respectively. The remaining portions of the first spacer layer 160 can be referred to as spacers 162. In some embodiments, the spacers 162 enclose the resistance switching elements 142 respectively. In some embodiments, the spacers 162 cover sidewalls of the resistance switching elements 142 and sidewalls of the top electrodes 152, and leave top surfaces of the top electrodes 152 and portions 122 of the dielectric layer 120 uncovered.

In some embodiments, the patterning of the first spacer layer 160 may include an etch process, such as an anisotropic etch. The patterning process may be dry etching, wet etching, or a combination thereof. In some embodiments where the first spacer layer 160 is silicon nitride, the patterning of the silicon nitride layer includes a dry etching using $CF_4$, $CHF_3$, $CH_3F$, $C_4F_8$, $C_4F_6$, $HBr$, $Cl_2$, or $CH_2F_2$ as an etchant, although other applicable etchants may be used. In some embodiments, the dielectric layer 120 has higher etch resistance to the etching the first spacer layer 160 than that of the first spacer layer 160, such that the first spacer layer 160 is etched until reaching the dielectric layer 120. In this way, the dielectric layer 120 can act as an etch stop layer that slows down or even stops the etching process. As illustrated in FIG. 1I, because portions 122 of the dielectric layer 120 under the removed portions of the first spacer layer 160 experiences the etching process performed to the first spacer layer 160, these portions 122 of the dielectric layer 120 may be thinned, so that these portions 122 are thinner than other portions of the dielectric layer 120 covered by the spacers 162.

Reference is made to FIG. 1J. A second spacer layer 170 is blanket formed over the dielectric layer 120, the spacers 162, and the stacks ST. The second spacer layer 170 may include suitable dielectric materials such as silicon nitride, silicon carbide, carbon-doped silicon nitride, carbon-doped silicon oxide, silicon oxynitride, and combinations thereof. In some embodiments, the second spacer layer 170 may also be a composite layer including two or more layers made of different materials, such as a silicon nitride/silicon carbide stack. The second spacer layer 170 may be formed using CVD, PVD, ALD, the like, and/or combinations thereof. In some embodiments, the first spacer layer 160 (referring to FIG. 1H) is formed at a first temperature, and the second spacer layer 170 is formed at a second temperature higher than the first temperature, such that a density of the second spacer layer 170 is greater than a density of the spacer 162.

Figure 1K:
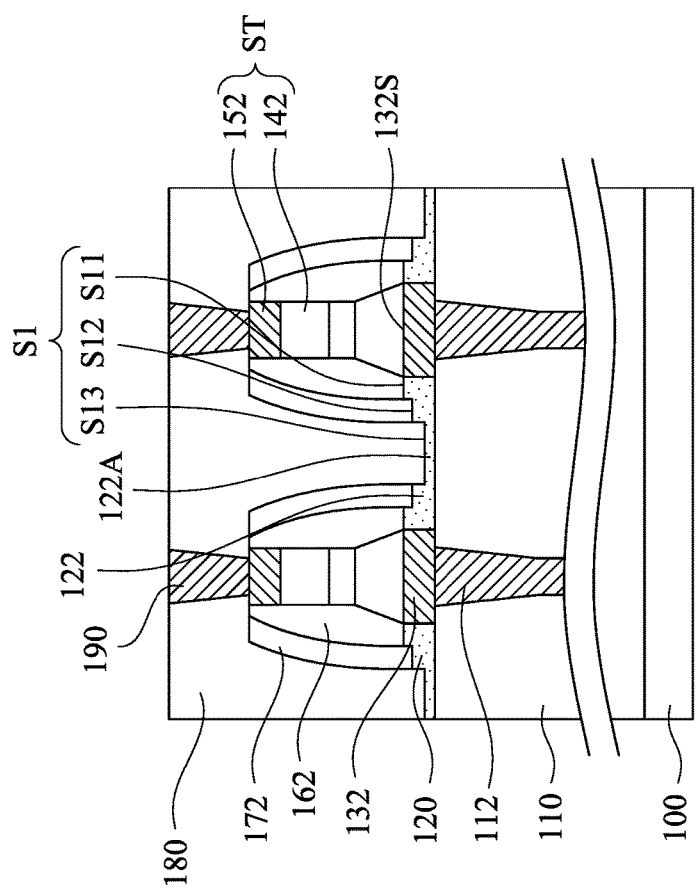

FIG. 1K illustrates patterning of the second spacer layer 170. The patterning process removes horizontal portions of the second spacer layer 170, while vertical portions of the second spacer layer 170 remain around the stacks ST respectively. The remaining portions of the second spacer layer 170 can be referred to as spacers 172. The spacers 172 are around the spacers 162 respectively. In some embodiments, the spacers 172 enclose the spacers 162 respectively. In some embodiments, the spacers 172 cover sidewalls of the stacks ST and leave the top surfaces of the top electrodes 134 and portions 122A of the dielectric layer 120 uncovered.

In some embodiments, the patterning of the second spacer layer 170 may include an etch process, such as an anisotropic etch. The patterning process may be dry etching, wet etching, or a combination thereof. In some embodiments where the second spacer layer 170 is silicon nitride, the patterning of the silicon nitride layer includes a dry etching using $CF_4$, $CHF_3$, $CH_3F$, $C_4F_8$, $C_4F_6$, $HBr$, $Cl_2$, or $CH_2F_2$ as an etchant, although other applicable etchants may be used. In some embodiments, the dielectric layer 120 has higher etch resistance to an etchant used in the patterning the second spacer layer 170 than that of the second spacer layer 170, such that the second spacer layer 170 is etched until reaching the dielectric layer 120. In this way, the dielectric layer 120 can act as an etch stop layer that slows down or even stops the etching process. As illustrated in FIG. 1K, because portions 122A of the dielectric layer 120 under the removed portions of the second spacer layer 170 experiences the etching process performed to the second spacer layer 170, these portions 122A of the dielectric layer 120 may be further thinned, so that these portions 122A are thinner than portions 122 of the dielectric layer 120 covered by the spacers 172, and other portions of the dielectric layer 120 covered by the spacers 162.

In some embodiments, since the dielectric layer 120 acts as an etch stop layer in multiple etching processes including the formation of the spacers 162 and 172, the dielectric layer 120 has a stepped top surface S1. The stepped top surface S1 may have high portions S11, middle portions S12 in a position lower than the high portion S11, and low portions S13 in a position lower than the middle portions S12. A substantially vertical sidewall connects a high portion S11 to a neighboring middle portion S12, and a substantially vertical sidewall connects a middle portion S12 to a neighboring low portion S13. The spacers 162 are over the high portions S11 of the stepped top surface S1 respectively. The spacers 172 are over the middle portions S12 of the stepped top surface S1 respectively. The low portions S13 are free from coverage of spacers 162 and 172.

The bottom electrodes 132 may penetrate through the stepped top surface S1. In the depicted embodiments, the top surfaces 132S of the bottom electrodes 132 are substantially level with the high portions S11 of the stepped top surface S1. In some other embodiments, the high portions S11 of the stepped top surface S1 may be lower than the top surfaces 132S of the bottom electrodes 132 because the dielectric layer 120 also experiences the etch operation used to form the resistance switching elements 142. For example, the etch operation used to pattern the resistance switching element layer 140 (referring to FIG. 1F) may thins a portion of the dielectric layer 120 in some embodiments, and the spacers 162 or 172 may be over the thinned portion of the dielectric layer 120.

An interlayer dielectric (ILD) layer 180 is then disposed over and around the stacks ST, and metal vias 190 are subsequently formed in the ILD layer 180 and respectively in contact with top electrodes 152 of the stacks ST. The resulting structure is illustrated in FIG. 1K. In some embodiments, the ILD layer 180 is over the thinned portion 122A of the dielectric layer 120, and in contact with the low portions S13 of the stepped top surface S1. The ILD layer 180 may have the same material as the underlying ILD layer 110. The ILD layer 180 may be an extra low-k dielectric (ELK) layer, such as carbon doped silicon dioxide, may be an oxide, such as silicon oxide, and/or may be the like or a combination thereof. In some embodiments, the ILD layer 180 may be formed of a low-k dielectric material having a k value less than about 3.9. The k value of the ILD layer 180 may even be lower than about 4.0. In some embodiments, the ILD layer 180 is separated from the bottom electrode 132 by at least one of the spacers 162 and 172. In some embodiments, the metal vias 190 may be copper, aluminum, the like, and/or a combination thereof. Formation of the ILD layer 180 and the metal vias 190 includes, for example, depositing the ILD layer 180 using a spin-on process, etching via holes in the ILD layer 180 to expose the respective top electrodes 152, filling the via holes with metals using a suitable deposition technique, and performing a planarization process (e.g. CMP) to remove metals outside the via holes while leaving metals in the via holes to serve as the metal vias 190.

As discussed above, the bottom electrode layer 130 is patterned into separate bottom electrodes 132 before the formation of the stacks ST, and hence this patterning process for the bottom electrode layer 130 will not damage the resistance switching elements 142 in the stacks ST. Moreover, since the patterning process does not damage the resistance switching elements 142, the overlay (OVL) control in a photolithography process of forming the photoresist mask 200 can be relaxed, which means the photolithography process window can be improved. Further, since the spacers 162 and 172 are formed after the patterning process, the spacers 162 and 172 will not be damaged by this patterning process.

Figure 2:
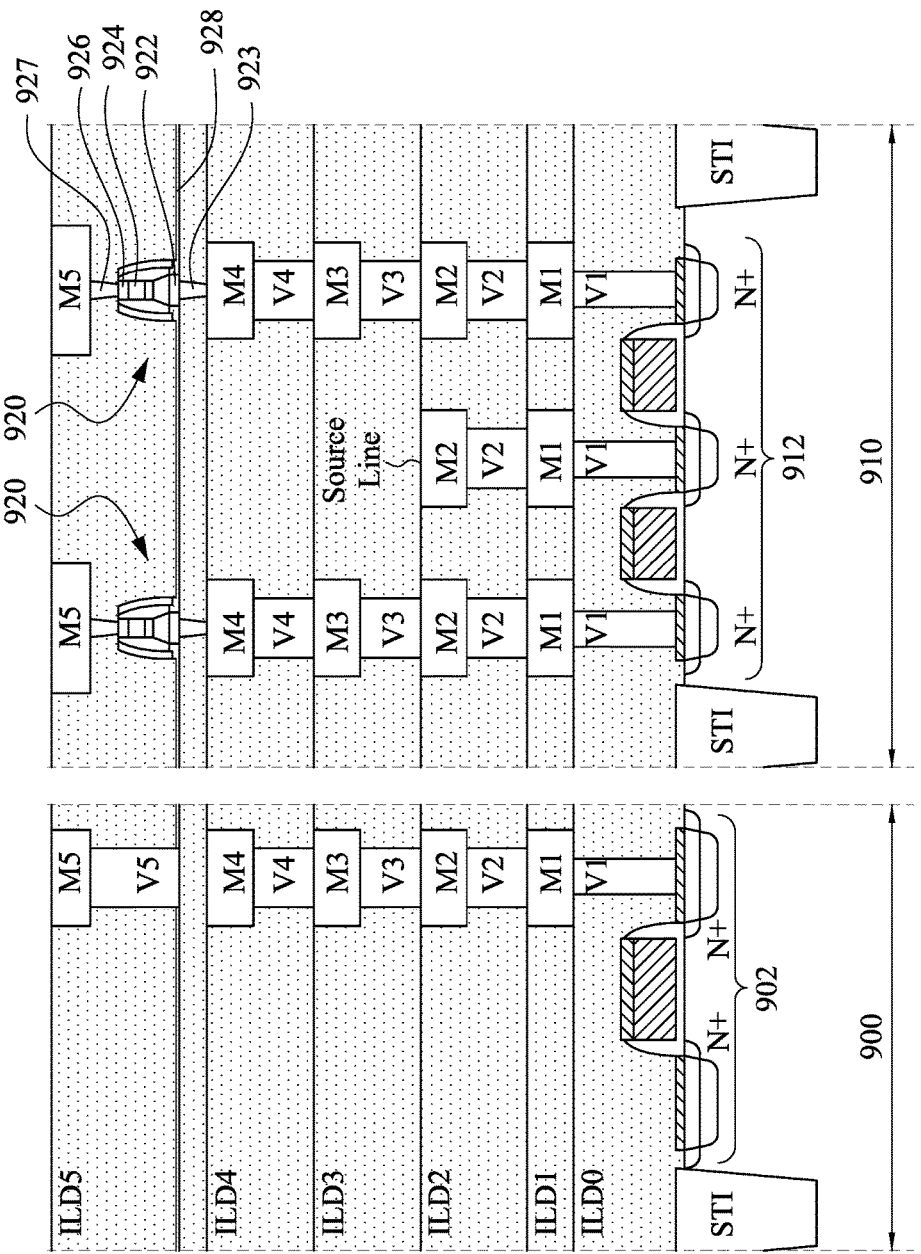
FIG. 2 illustrates an integrated circuit in accordance with some embodiments.

FIG. 2 illustrates an integrated circuit in accordance with some embodiments. The integrated circuit includes a logic region 900 and a memory region 910. The logic region 900 may include circuitry, such as an exemplary logic transistor 902, for processing information received from memory cells 920 in the memory region 910 and for controlling reading and writing functions of memory cells 920. In some embodiments, the memory cell 920 may include a bottom electrode 922 and a top electrode 926, with a resistance switching element 924 sandwiched in between the bottom and top electrodes 922 and 926. The bottom electrode 922 is embedded in a dielectric layer 928.

As depicted, an exemplary integrated circuit is fabricated using five metallization layers, labeled as M1 through M5, with five layers of metallization vias or interconnects, labeled as V1 through V5. Other embodiments may contain more or fewer metallization layers and a corresponding more or fewer number of vias. Logic region 900 includes a full metallization stack, including a portion of each of metallization layers M1-M5 connected by interconnects V2-V5, with V1 connecting the stack to a source/drain contact of the logic transistor 902. The memory region 910 includes a full metallization stack connecting the memory cells 920 to transistors 912 in the memory region 910, and a partial metallization stack connecting a source line to the transistors 912 in the memory region 910. The memory cells 920 are depicted as being fabricated in between the M4 layer and the M5 layer. The memory cell 920 may further include a bottom electrode via 923 and a top electrode via 927. The bottom electrode 922 is electrically connected with the metallization layer M4 through the bottom electrode via 923, and the top electrode 926 is electrically connected with the metallization layer M5 through the top electrode via 927. Also included in integrated circuit is a plurality of ILD layers. Six ILD layers, identified as ILD0 through ILD5 are depicted in FIG. 2 as spanning the logic region 900 and the memory region 910. The ILD layers may provide electrical insulation as well as structural support for the various features of the integrated circuit during many fabrication process steps.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the resistance switching elements (e.g. MTJ), top electrodes and/or spacers of memory devices are not damaged by the patterning process of the bottom electrode layer. Another advantage is that the OVL control for patterning the bottom electrode layer can be relaxed. Yet another advantage is that the dielectric layer used to define the bottom electrodes can act as a stop layer against subsequent CMP and/or etching processes.

According to some embodiments of the present disclosure, a method for manufacturing a memory device, the method includes forming an opening in a dielectric layer; overfilling the opening with a bottom electrode layer; removing a first portion of the bottom electrode layer outside the opening, while leaving a second portion of the bottom electrode layer in the opening to form a bottom electrode; and forming a stack over the bottom electrode, the stack comprising a resistance switching element in contact with the bottom electrode and a top electrode over the resistance switching element.

In some embodiments, the removing the first portion of the bottom electrode layer includes etching back the bottom electrode layer until reaching the dielectric layer, wherein the dielectric layer has higher etch resistance to the etching back than that of the bottom electrode layer.

In some embodiments, removing the first portion of the bottom electrode layer includes performing a chemical-mechanical polish process to the bottom electrode layer until reaching the dielectric layer, wherein the dielectric layer has higher resistance to the chemical-mechanical polish process than that of the bottom electrode layer.

In some embodiments, the forming the stack over the bottom electrode includes forming a resistance switching element layer over the bottom electrode and the dielectric layer; and removing a first portion of the resistance switching element layer while leaving a second portion of the resistance switching element layer over the bottom electrode to form the resistance switching element.

In some embodiments, the removing the first portion of the resistance switching element layer includes etching the resistance switching element layer, wherein the dielectric layer has higher etch resistance to the etching the resistance switching element layer than that of the resistance switching element layer.

In some embodiments, the etching the resistance switching element thins a portion of the dielectric layer.

In some embodiments, the method further includes forming a spacer along a sidewall of the stack and over the dielectric layer.

In some embodiments, the method further includes forming a spacer layer over and around the stack; and removing a first portion of the spacer layer while leaving a second portion of the spacer layer around the stack to form the spacer using an etch process, wherein the dielectric layer has higher etch resistance to the etch process than that of the spacer layer.

In some embodiments, the etch process thins a portion of the dielectric layer.

In some embodiments, the method further includes forming an interlayer dielectric layer over the thinned portion of the dielectric layer.

According to some embodiments of the present disclosure, a method for manufacturing a memory device, the method includes forming a dielectric layer over an interlayer dielectric layer having an metallization pattern; patterning the dielectric layer using a patterned photoresist mask to form an opening that exposes the metallization pattern; forming a bottom electrode in the opening and over the exposed metallization pattern; and forming a stack over the bottom electrode, the stack comprising a resistance switching element in contact with the bottom electrode and a top electrode over the resistance switching element.

In some embodiments, the forming the stack comprises an etch operation, and the dielectric layer has higher etch resistance to the etch operation than that of the resistance switching element layer.

In some embodiments, the etch operation thins a portion of the dielectric layer.

In some embodiments, the method further includes forming a spacer over the thinned portion of the dielectric layer.

In some embodiments, the forming the bottom electrode in the opening includes overfilling the opening in the dielectric layer with a bottom electrode layer; and performing a planarization process to the bottom electrode layer until the dielectric layer is exposed.

According to some embodiments of the present disclosure, a memory device includes a dielectric layer, at least one bottom electrode, at least one resistance switching element, and at least one top electrode. The dielectric layer has a stepped top surface. The bottom electrode is embedded in the dielectric layer and penetrating through the stepped top surface of the dielectric layer. The resistance switching element is over the bottom electrode. The top electrode is over the resistance switching element.

In some embodiments, the memory device further includes a first spacer enclosing the resistance switching element, wherein the first spacer is over a first portion of the stepped top surface of the dielectric layer.

In some embodiments, the memory device further includes a second spacer enclosing the first spacer, wherein the second spacer is over a second portion of the stepped top surface that is in a position lower than the first portion of the stepped top surface.

In some embodiments, the stepped top surface has a third portion in a position lower than the second portion of the stepped top surface.

In some embodiments, the memory device further includes an interlayer dielectric layer in contact with the third portion of the stepped top surface.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a memory device, comprising:
   forming a dielectric layer that has a bottom surface above a top surface of a metallization pattern;
   forming an opening in the dielectric layer;
   overfilling the opening with a bottom electrode layer;
   removing a first portion of the bottom electrode layer outside the opening, while leaving a second portion of the bottom electrode layer in the opening to form a bottom electrode in contact with the top surface of the metallization pattern; and
   forming a stack over the bottom electrode, the stack comprising a resistance switching element in contact with the bottom electrode and a top electrode over the resistance switching element.

2. The method of claim 1, wherein the removing the first portion of the bottom electrode layer comprises:
   etching back the bottom electrode layer until reaching the dielectric layer, wherein the dielectric layer has higher etch resistance to the etching back than that of the bottom electrode layer.

3. The method of claim 1, the removing the first portion of the bottom electrode layer comprises:
   performing a chemical-mechanical polish process to the bottom electrode layer until reaching the dielectric layer, wherein the dielectric layer has higher resistance to the chemical-mechanical polish process than that of the bottom electrode layer.

4. The method of claim 1, wherein the forming the stack over the bottom electrode comprises:
   forming a resistance switching element layer over the bottom electrode and the dielectric layer; and
   removing a first portion of the resistance switching element layer while leaving a second portion of the resistance switching element layer over the bottom electrode to form the resistance switching element.

5. The method of claim 4, wherein the removing the first portion of the resistance switching element layer comprises:
   etching the resistance switching element layer, wherein the dielectric layer has higher etch resistance to the etching the resistance switching element layer than that of the resistance switching element layer.

6. The method of claim 5, wherein the etching the resistance switching element thins a portion of the dielectric layer.

7. The method of claim 1, further comprising:
   forming a spacer along a sidewall of the stack and over the dielectric layer.

8. The method of claim 7, wherein the forming the spacer comprises:
   forming a spacer layer over and around the stack; and
   removing a first portion of the spacer layer while leaving a second portion of the spacer layer around the stack to form the spacer using an etch process, wherein the dielectric layer has higher etch resistance to the etch process than that of the spacer layer.

9. The method of claim 8, wherein the etch process thins a portion of the dielectric layer.

10. The method of claim 9, further comprising:
forming an interlayer dielectric layer over the thinned portion of the dielectric layer.

11. A method for manufacturing a memory device, the method comprising:
forming a dielectric layer over an interlayer dielectric layer having an metallization pattern;
patterning the dielectric layer using a patterned photoresist mask to form an opening that exposes the metallization pattern;
forming a bottom electrode in the opening and over the exposed metallization pattern;
forming a stack over the bottom electrode, the stack comprising a resistance switching element in contact with the bottom electrode and a top electrode over the resistance switching element; and
prior to forming the resistance switching element, removing a portion of the bottom electrode to expose the dielectric layer.

12. The method of claim 11, wherein the forming the stack comprises an etch operation, and the dielectric layer has higher etch resistance to the etch operation than that of the resistance switching element layer.

13. The method of claim 12, wherein the etch operation thins a portion of the dielectric layer.

14. The method of claim 13, further comprising:
forming a spacer over the thinned portion of the dielectric layer.

15. The method of claim 11, wherein the forming the bottom electrode in the opening comprises:
overfilling the opening in the dielectric layer with a bottom electrode layer; and
performing a planarization process to the bottom electrode layer until the dielectric layer is exposed.

16. A memory device, comprising:
a dielectric layer having a stepped top surface;
at least one bottom electrode embedded in the dielectric layer and penetrating through the stepped top surface of the dielectric layer;
at least one resistance switching element over the bottom electrode;
a first spacer on a sidewall of the resistance switching element and in contact with the dielectric layer; and
at least one top electrode over the resistance switching element.

17. The memory device of claim 16,
wherein the first spacer is over a first portion of the stepped top surface of the dielectric layer.

18. The memory device of claim 16, further comprising:
a second spacer on a sidewall of the first spacer, wherein the second spacer is over a second portion of the stepped top surface that is in a position lower than a first portion of the stepped top surface.

19. The memory device of claim 18, wherein the stepped top surface has a third portion in a position lower than the second portion of the stepped top surface.

20. The memory device of claim 19, further comprising:
an interlayer dielectric layer in contact with the third portion of the stepped top surface.

* * * * *